US006989520B2

(12) United States Patent
Mochiduki et al.

(10) Patent No.: US 6,989,520 B2
(45) Date of Patent: Jan. 24, 2006

(54) EMISSION CONTROL APPARATUS WITH SETTABLE TARGET INTENSITY AND IMAGE FORMING APPARATUS USING SAME

(75) Inventors: Masataka Mochiduki, Shizuoka (JP); Yasuhiro Tomioka, Shizuoka (JP)

(73) Assignee: Canon Kabushiki Kaisha, Tokyo (JP)

(*) Notice: Subject to any disclaimer, the term of this patent is extended or adjusted under 35 U.S.C. 154(b) by 332 days.

(21) Appl. No.: 10/411,301

(22) Filed: Apr. 11, 2003

(65) Prior Publication Data

US 2003/0213890 A1 Nov. 20, 2003

(30) Foreign Application Priority Data

Apr. 12, 2002 (JP) ............................ 2002-110488

(51) Int. Cl.
*G01D 9/42* (2006.01)
*H01S 3/10* (2006.01)

(52) U.S. Cl. .................. 250/205; 347/246; 372/29.014

(58) Field of Classification Search ................ 250/205; 346/107.1–107.6; 372/29.02–32, 38.1, 38.01; 347/247
See application file for complete search history.

(56) References Cited

U.S. PATENT DOCUMENTS

| | | | | |
|---|---|---|---|---|
| 3,246,247 | A | 4/1966 | Grindle | 328/34 |
| 4,532,496 | A | 7/1985 | Ichinose | 340/347 |
| 5,043,745 | A * | 8/1991 | Inoue et al. | 347/246 |
| 5,050,177 | A | 9/1991 | Ema | 372/38 |
| 5,515,392 | A | 5/1996 | Teremy | 372/38 |
| 6,185,233 | B1 * | 2/2001 | Moothart et al. | 372/32 |

FOREIGN PATENT DOCUMENTS

| | | |
|---|---|---|
| EP | 358171 | 3/1990 |
| EP | 1061618 | 12/2000 |

* cited by examiner

*Primary Examiner*—Stephone B. Allen
(74) *Attorney, Agent, or Firm*—Fitzpatrick, Cella, Harper & Scinto

(57) ABSTRACT

There is provided an emission control apparatus with which it is capable of variably controlling the intensity of a light beam to be set, in a stable manner and at a low cost without increasing the circuit size. A semiconductor laser diode LD emits a light beam. A photo diode PD detects the intensity of the light beam emitted from the semiconductor laser diode LD. A driving circuit supplies driving current to the semiconductor laser diode LD. A switching section switches the driving current according to a video signal. An input terminal receives a pulse width modulation signal. A smoothing circuit smoothes the received pulse width modulation signal. A laser driver controls a value of the driving current according to smoothed voltage obtained by the smoothing circuit such that the detected intensity of the light beam is equal to a target intensity.

8 Claims, 7 Drawing Sheets

EMISSION CONTROL APPARATUS WITH SETTABLE TARGET INTENSITY AND IMAGE FORMING APPARATUS USING SAME

BACKGROUND OF THE INVENTION

1. Field of the Invention

The present invention relates to an emission control apparatus that controls the intensity of laser light emitted from a semiconductor laser serving, for example, as a light source for writing image information, and an image forming apparatus such as electrophotographic laser printer, copying machine, or laser facsimile, which includes the emission control apparatus.

2. Description of the Related Art

FIG. 6 is a block diagram showing the general construction of a control system in an electrophotographic laser printer including a conventional laser control apparatus.

In the control system in FIG. 6, a laser beam emitted forward (to the right in FIG. 6) from a semiconductor laser diode 301 is collimated by a collimator lens 302, and deviated by a polariscope 303 comprised of a rotary polygon mirror to be irradiated onto a photosensitive drum 305 via an fθ lens 304. The photosensitive drum 305 has a surface thereof evenly electrified in advance by an electrifier. The photosensitive drum 305 rotates in response to forward and backward scanning of image forming spots by the rotation of the rotary polygon mirror in the direction of the rotational axis (axial direction) of the photosensitive drum 305, so that the entire surface of an image forming region on the photosensitive drum 305 is scanned. It should be noted that in the forward and backward scanning of the photosensitive drum in the axial direction thereof, the laser beam scans not only the image forming region but also marginal regions (non-image forming regions) provided at both sides of the image forming region on the photosensitive drum 305.

A photodetector 306 is provided at one point on the scanning line of the laser beam and outside the image forming region, and detects the laser beam deviated by the rotary polygon mirror in every scanning to generate a BD signal. According to the BD signal transmitted from the photodetector 306, a signal processing circuit 307 controls timing in which an image signal is applied to a semiconductor laser control circuit 308 of a laser control apparatus 300.

The semiconductor laser control circuit 308 turns on/off the semiconductor laser diode 301 according to the image signal transmitted from the signal processing circuit 307 to form an electrostatic latent image on the photosensitive drum 305. The electrostatic latent image is developed by a developing device and transferred onto a sheet or the like by a transfer device.

On the other hand, a laser beam emitted backward (to the left in FIG. 6) from the semiconductor laser diode 301 falls on a photodetector 309 which is composed of a photo diode, and the photodetector 309 detects the intensity of the laser beam. Then, a PD monitor section 310 as a control circuit controls the semiconductor laser control circuit 308 according to an output signal from the photodetector 309 such that the intensity of light outputted from the semiconductor laser diode 301 becomes equal to a target value. On this occasion, the PD monitor section 310 provides control such that values of current for driving respective light-emitting elements of the semiconductor laser diode 301 are regulated according to external signals corresponding to the respective light-emitting elements so that the intensities of light beams outputted from the respective light-emitting elements become equal to a fixed value, and are held at the regulated values.

FIG. 7 is a circuit diagram showing the detailed configuration of the laser control apparatus 300 in FIG. 6, and the laser control apparatus 300 is comprised of a control system that provides APC (Auto Power Control) control using sample-hold control, which is one of conventional methods for controlling laser light.

As shown in FIG. 7, the laser control apparatus is comprised of a laser driving section 211 that drives the semiconductor laser diode 301, a resistance 202 that limits current to be supplied to the semiconductor laser diode 301, an APC control section 212 that controls the intensity of light emitted from the semiconductor laser diode 301, a sample-hold capacitor 203 that determines electric charge to be accumulated when laser light is emitted during the APC control, the PD monitor section 310 that detects current flowing through the photodetector 309 composed of a photodiode in terms of voltage converted from current by a resistor 206, and a band gap 217 that supplies a reference voltage for current-to-voltage conversion of monitor current flowing through the photodiode 309 when laser light is emitted during the APC control.

With the laser control apparatus 300 constructed as above, the PD monitor section 310 causes the resistor 206 thereof to perform current-to-voltage conversion of the monitor current flowing through the photodiode 309 according to the intensity of light emitted from the semiconductor laser diode 301. The resulting voltage is then applied to an input terminal of a comparator 405 in the APC control section 212. Another input terminal of the comparator 405 is connected to the band gap 217 such that the voltage outputted from the PD monitor section 310 is compared with the reference voltage supplied from the band gap 217.

An output terminal of the comparator 405 is connected to an input terminal of a voltage controller 407 including a feedback loop such that voltage to be applied to the laser driving section 211 is controlled. According to the voltage thus controlled, the laser driving section 211 causes the semiconductor laser diode 301 to emit laser light. In this way, the intensity of laser light emitted from the semiconductor laser diode 301 is controlled.

To control the intensity of the emitted light in this way enables adjustment of the laser light intensity within a short period of time, and thus, the APC can be provided during the scanning of the marginal regions in one scanning where the laser beam scans the photosensitive drum 305 in the axial direction thereof (so-called inter-line APC).

In the above described conventional laser control apparatus that controls the intensity of laser light according to a voltage value obtained by current-to-voltage conversion of the monitor current flowing through the photodiode 309 and the reference voltage supplied from the band gap 217 during the APC, to vary the laser light intensity to be set, a method can be envisaged in which the setting of the reference voltage is changed. For example, a circuit implementing this method is configured such that resistances are connected in parallel with a circuit that sets the reference voltage, to be selectively turned on/off by a switch. However, this configuration has the problem that the circuit size and the cost increase.

Further, to variably control the intensity of laser light, a method has been proposed in which a voltage value obtained by current-to-voltage conversion of the monitor current is analog-to-digital converted, and the resulting voltage is compared with a predetermined reference voltage in terms of digital values (refer to Japanese Laid-Open Patent Publication (Kokai) No. 10-335732). According to this method, although it is possible to freely set the laser light intensity, it takes much time to adjust the laser light intensity. For this reason, a high-speed printer, for example, cannot provide the APC during the scanning of the marginal regions in one scanning where the laser beam scans the photosensitive drum 305 in the axial direction thereof, and thus the APC needs to be provided during printing of each page (so-called inter-page APC).

SUMMARY OF THE INVENTION

It is therefore an object of the present invention to provide an emission control apparatus that is capable of variably controlling the intensity of a light beam to be set, in a stable manner and at a low cost without increasing the circuit size.

It is another object of the present invention to provide an image forming apparatus that includes the above emission control apparatus and is capable of setting the optimum intensity of a light beam for printing.

To attain the above object, in a first aspect of the present invention, there is provided an emission control apparatus comprising a light emitting element that emits a light beam, a light receiving element that detects an intensity of the light beam emitted from the light emitting element, a driving unit that supplies driving current to the light emitting element, a switching unit that switches the driving current according to a video signal, a receiving terminal that receives a pulse width modulation signal, a smoothing unit that smoothes the received pulse width modulation signal, and a controller that controls a value of the driving current according to smoothed voltage obtained by the smoothing unit such that the detected intensity of the light beam is equal to a target intensity.

Preferably, the emission control apparatus further comprises a current-to-voltage converter that converts current corresponding to the detected intensity of the light beam outputted from the light receiving element into voltage, and a comparator that carries out comparison between the voltage obtained by converting the current and the smoothed voltage, wherein the controller controls the value of the driving current according to a result of the comparison.

More preferably, the emission control apparatus still further comprises a stabilizing unit that stabilizes amplitude of the received pulse width modulation signal.

Preferably, the emission control apparatus further comprises a current generator that generates current according to the smoothed voltage, and a current-to-voltage converter that converts current obtained by adding together the current generated by the current generator and current corresponding to the detected intensity of the light beam outputted from the light receiving element, into voltage, wherein the controller controls the driving current according to the voltage converted from the current.

More preferably, the emission control apparatus further comprises a stabilizing unit that stabilizes amplitude of the received pulse width modulation signal.

To attain the above other object, in a second aspect of the present invention, there is provided an image forming apparatus including the emission control apparatus described above.

The above objects and other objects, features, and advantages of the invention will become more apparent from the following detailed description taken in conjunction with the accompanying drawings.

DETAILED DESCRIPTION OF THE PREFERRED EMBODIMENTS

The present invention will now be described in detail with reference to the drawings showing embodiments thereof.

Figure 1:
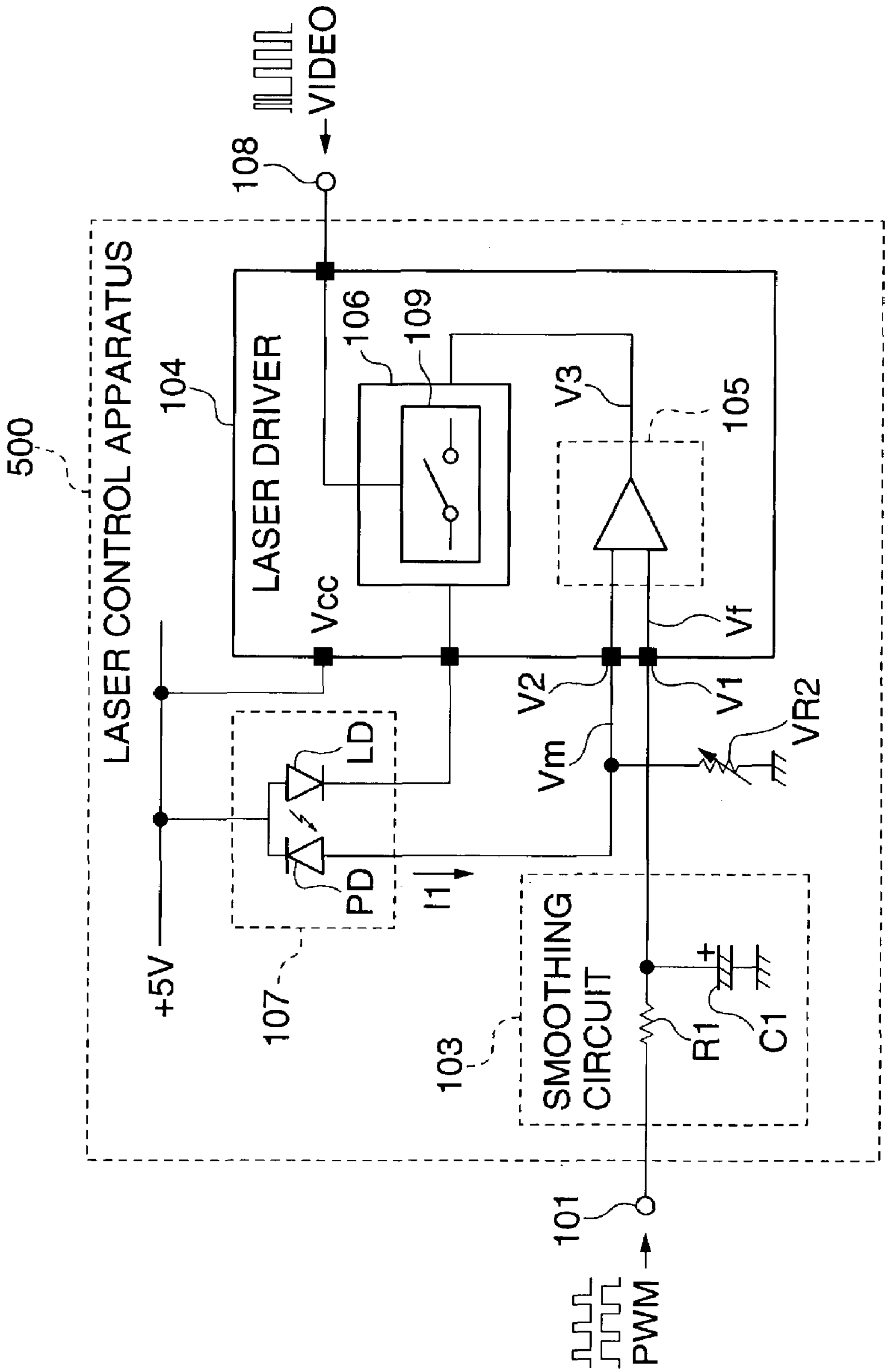
FIG. 1 is a circuit diagram showing the construction of a laser control apparatus as an emission control apparatus according to a first embodiment of the present invention.

FIG. 1 is a circuit diagram showing the construction of a laser control apparatus as an emission control apparatus according to a first embodiment of the present invention.

Figure 6:
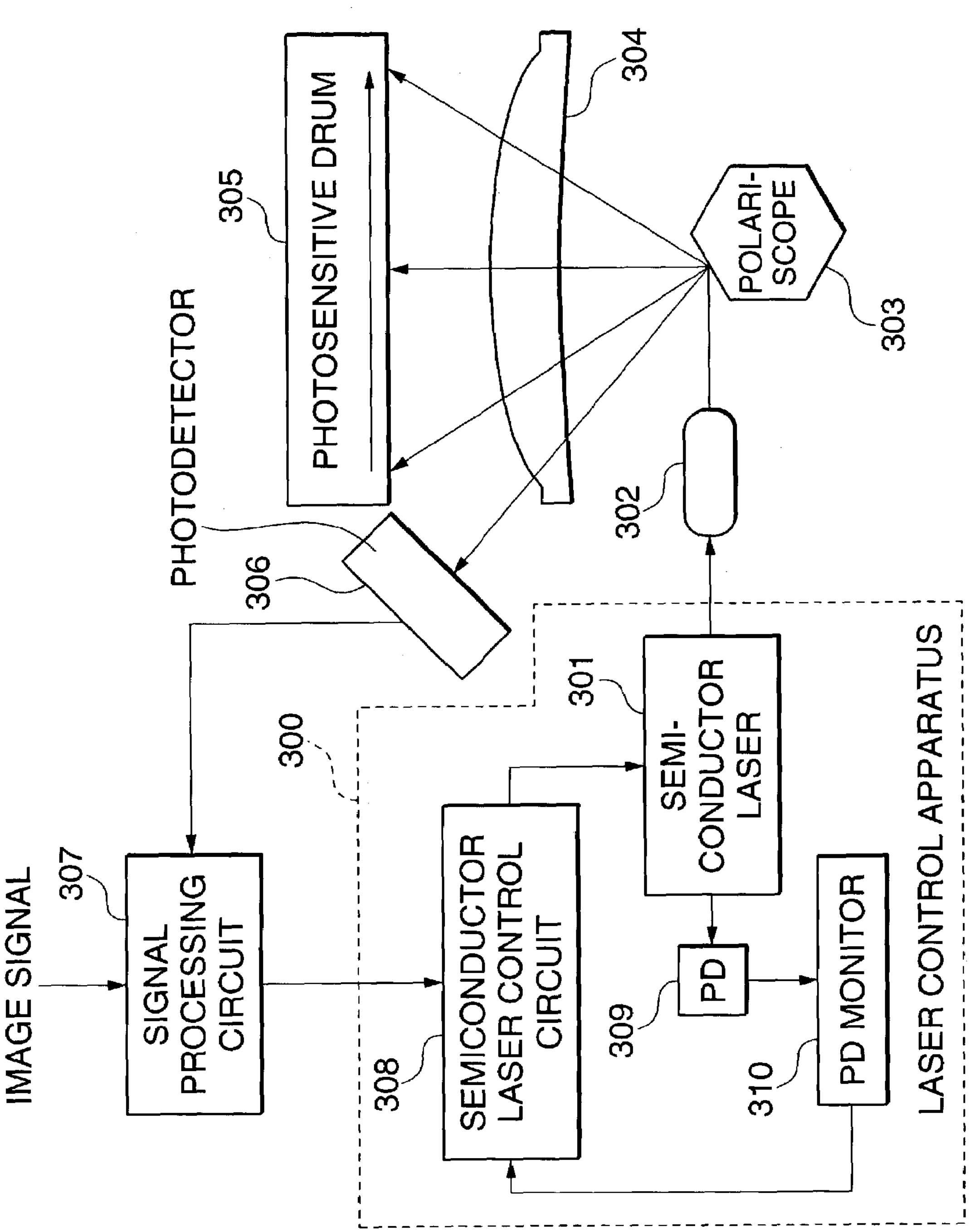
FIG. 6 is a block diagram showing the general construction of a control system of an electrophotographic laser printer including a conventional laser control apparatus.
Figure 7:
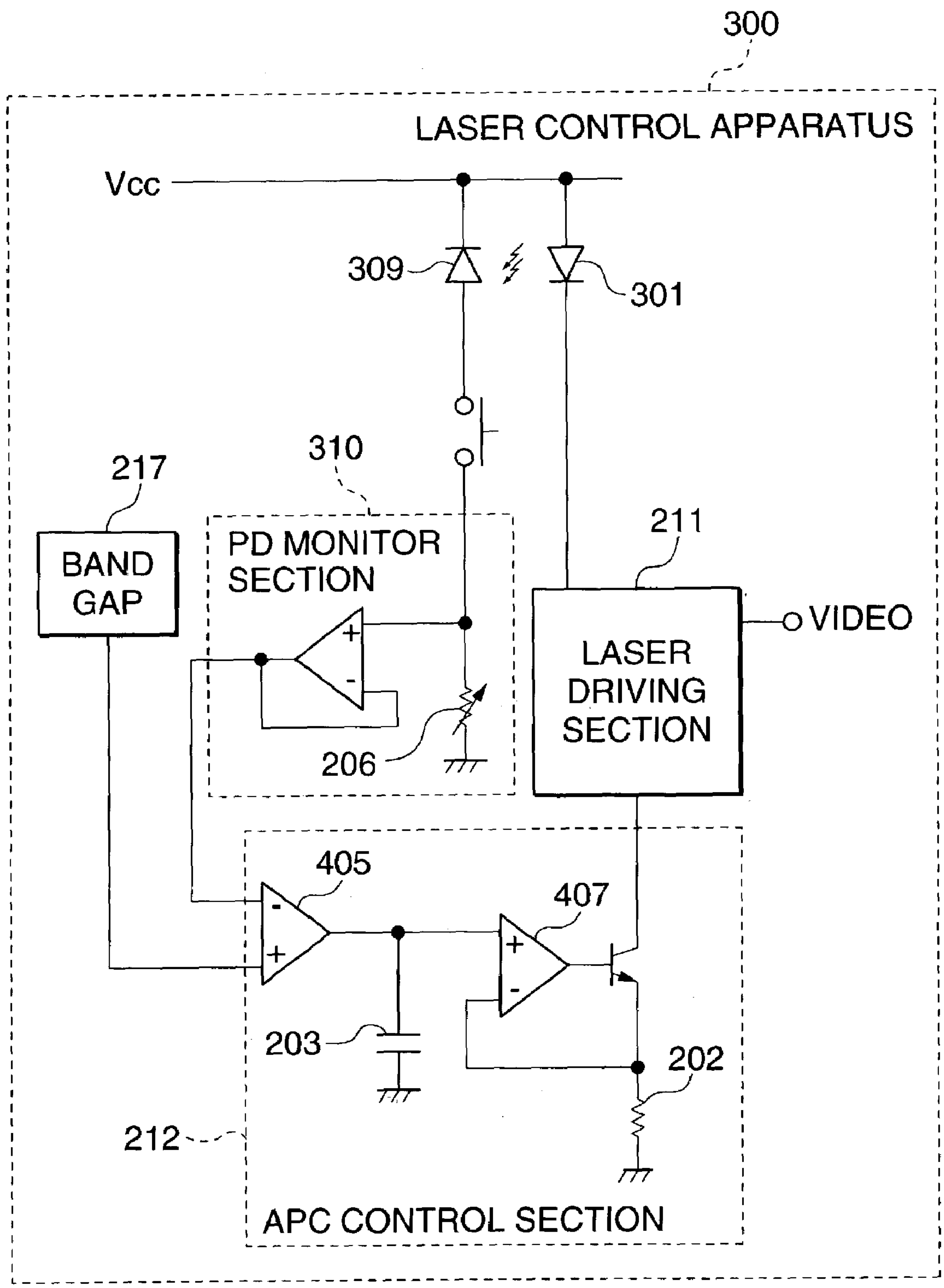
FIG. 7 is a circuit diagram showing the detailed construction of the laser control apparatus in FIG. 6.

A laser control apparatus 500 according to the present embodiment is employed in place of the conventional laser control apparatus 300 in the control system of the electrophotographic laser printer in FIG. 6.

In FIG. 1, a semiconductor laser section 107 is comprised of a semiconductor laser diode LD that emits laser beams forward and backward, and a photo diode PD that serves as a photodetector and receives the laser beam (back beam) emitted backward from the LD. The laser beam emitted forward from the LD is used for forming an electrostatic latent image as in the prior art.

An input terminal 101 receives a PWM signal for setting a laser light intensity reference voltage Vf from a CPU in a DC controller, not shown, provided outside the laser control apparatus 500. The CPU transmits the PWM signal, whose pulse width corresponds to the laser light intensity to be set, to the input terminal 101 of the laser control apparatus 500.

The PWM signal has a voltage amplitude of approximately 3.6V, and the frequency thereof is considerably lower than that of a video signal described later.

The PWM signal is inputted to a smoothing circuit 103 that is comprised of a resistance R1 and a capacitor C1, so that the PWM signal is converted from a pulse signal into direct current voltage. The resulting direct current voltage outputted from the smoothing circuit 103 is applied to an input terminal V1 of a laser light intensity setting amplifier 105 provided in a laser driver 104. The voltage applied to the input terminal V1 is set as the laser light intensity reference voltage Vf to be used in the so-called laser APC.

An input terminal 108 to which the video signal is inputted from an image processing section, not shown, is connected to a switching section 109 in a driving circuit 106 provided in the laser driver 104.

A description will now be given of the APC operation which is carried out by monitoring the laser light intensity using the photo diode PD of the semiconductor laser section 107.

The photo diode PD generates a current (detection current) I1 corresponding to the intensity of laser light emitted from the semiconductor laser diode LD. The current I1 is converted into a voltage Vm (laser light intensity monitor voltage) by a variable resistor VR2, and the resulting voltage Vm is applied to an input terminal V2 of the laser light intensity setting amplifier 105. The relationship between the current I1, voltage Vm, and variable resistor VR2 is expressed by Vm=I1*VR2.

The laser light intensity setting amplifier 105 compares the laser light intensity monitor voltage Vm with the laser light intensity reference voltage Vf, and outputs an output voltage V3 as the comparison result.

An output terminal of the laser light intensity setting amplifier 105 is connected to the driving circuit 106. The driving circuit 106 generates driving current according to the output voltage V3 outputted from the laser light intensity setting amplifier 105, and supplies the driving current to the semiconductor laser diode LD so that the semiconductor laser diode LD emits laser light with a target light intensity.

It should be noted that the switching section 109 in the driving circuit 106 performs switching in response to the video signal inputted via the input terminal 108, and accordingly, the semiconductor laser diode LD flashes in response to the video signal to thus form an image.

According to the present embodiment, since the laser control apparatus is configured that the PWM signal inputted from outside is used as the laser light intensity reference voltage Vf as the reference voltage in the APC, it is possible to variably control the intensity of laser light with a simple arrangement. As a result, an image forming apparatus such as an electrophotographic laser printer including the above described laser control apparatus can set the optimum laser light intensity for image formation.

Incidentally, in consideration of the fact that the amplitude of the PWM signal may fluctuate with variations in voltage supplied from a power supply of the main body of the laser printer, it is preferred that if a high accuracy is required, the voltage of the power supply is adjusted when the printer is assembled and when the scanner unit is replaced.

A description will now be given of a second embodiment of the present invention. The second embodiment differs from the first embodiment in that the voltage amplitude of the PWM signal is stabilized.

Figure 2:
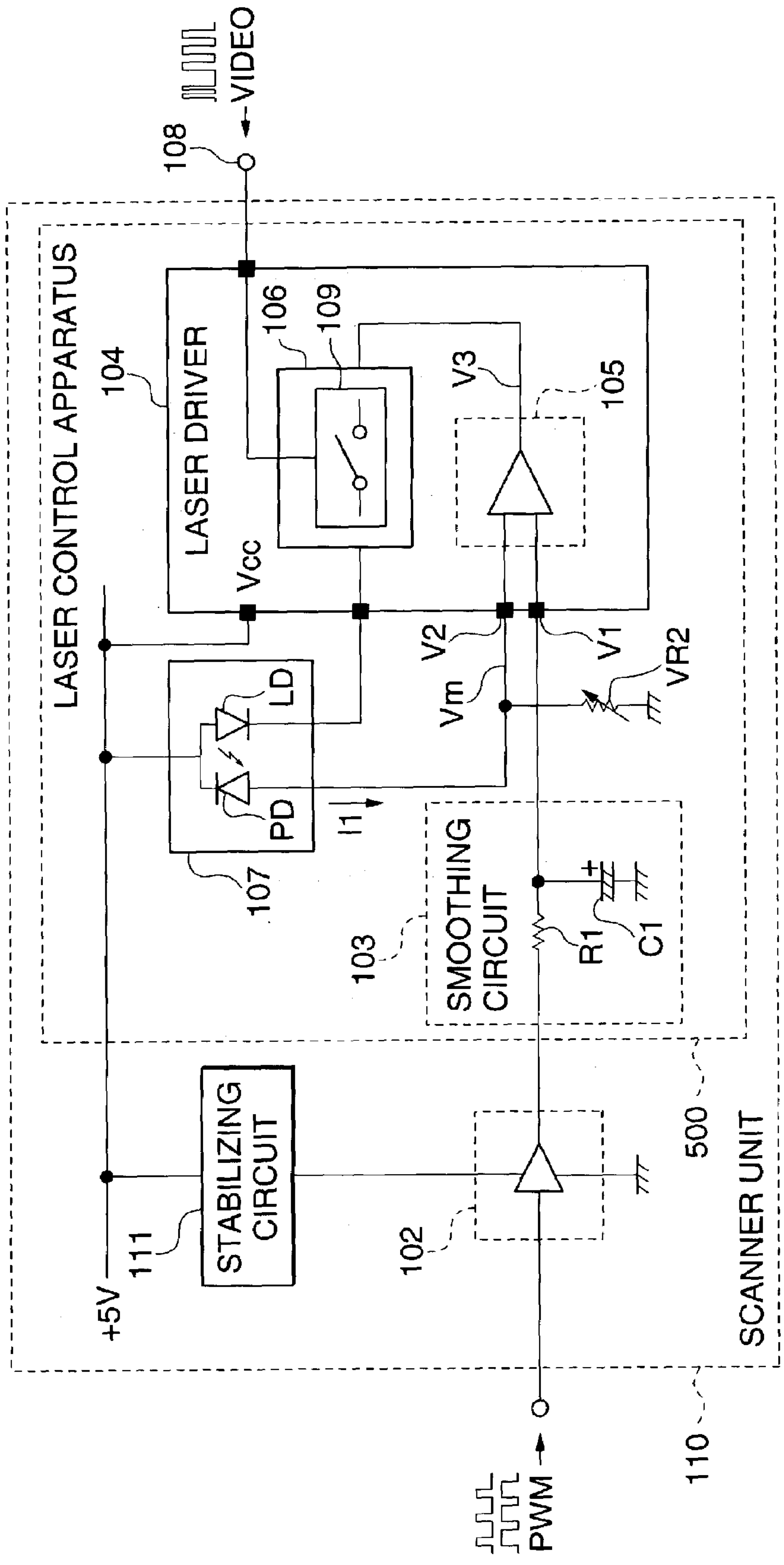
FIG. 2 is a circuit diagram showing the construction of a laser control apparatus as an emission control apparatus according to a second embodiment of the present invention.
Figure 3:
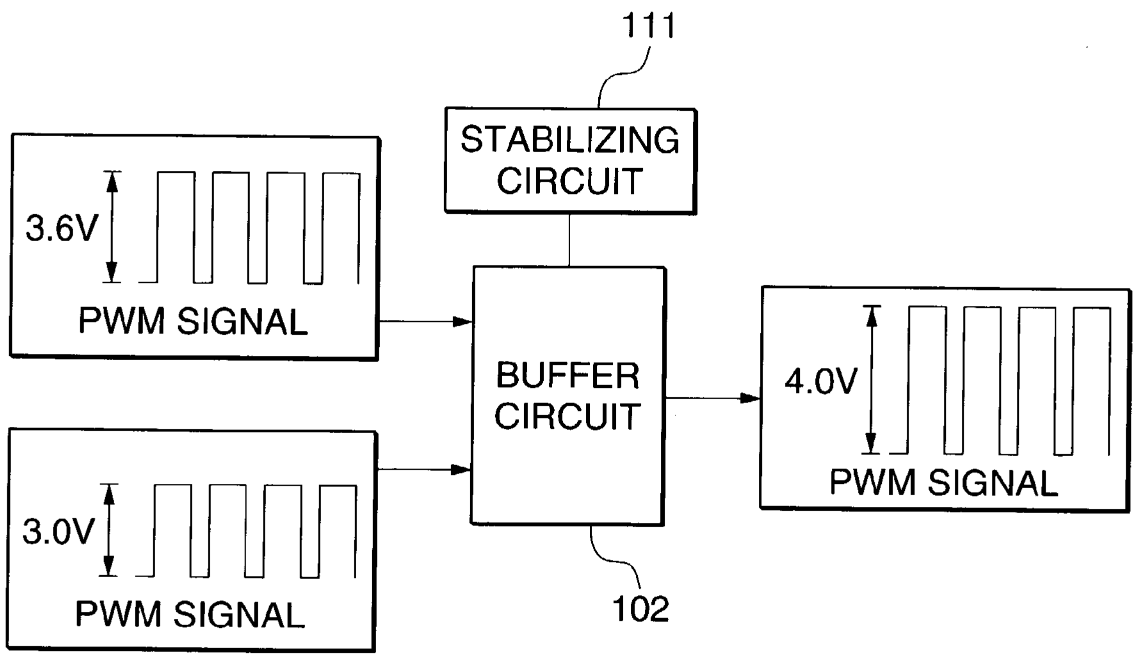
FIG. 3 is a view useful in explaining how the voltage amplitude of a PWM signal is stabilized.

FIG. 2 is a circuit diagram showing a laser control apparatus as an emission control apparatus according to the second embodiment. Elements and parts corresponding to those in FIG. 1 are denoted by the same reference numerals, and description thereof is omitted.

In the present embodiment, in the same laser light intensity setting system as in the first embodiment, a stabilizing circuit 111 and a buffer circuit 102 are provided in a scanner unit 110 so as to stabilize the voltage amplitude of the PWM signal. The PWM signal is inputted to the buffer circuit 102, and is converted into voltage with constant amplitude according to output voltage supplied from the stabilizing circuit 111, to be outputted from the buffer circuit 102.

A description will now be given of the operation of the buffer circuit 102.

Assuming that the set output voltage of the stabilizing circuit 111 is 4V, if the PWM signal whose amplitude fluctuates in the range of 3.0 to 3.6V is inputted to the buffer circuit 102, the voltage amplitude of the PWM signal having passed the buffer circuit 102 is constant at 4V. As a result, the laser light intensity setting reference voltage Vf can be stabilized.

According to the present embodiment, providing the stabilizing circuit 11 and the buffer circuit 102 in the scanner unit 110 eliminates the necessity of adjusting the voltage of the power supply when the printer is assembled and when the scanner unit 110 is replaced.

A description will now be given of a third embodiment of the present invention.

In the above described first and second embodiments, the smoothed voltage of the PWM signal is supplied as the laser light intensity setting reference voltage Vf of the laser light intensity setting amplifier 105 to make variable the laser light intensity setting reference voltage Vf according to the pulse width of the PWM signal so that the laser light intensity can be variably controlled, but in the present embodiment, the laser light intensity setting reference voltage Vf is not made variable but the laser light intensity can be variably controlled by adding current according to the PWM signal to the detection current I1 generated by the photo diode PD according to the laser light intensity.

Figure 4:
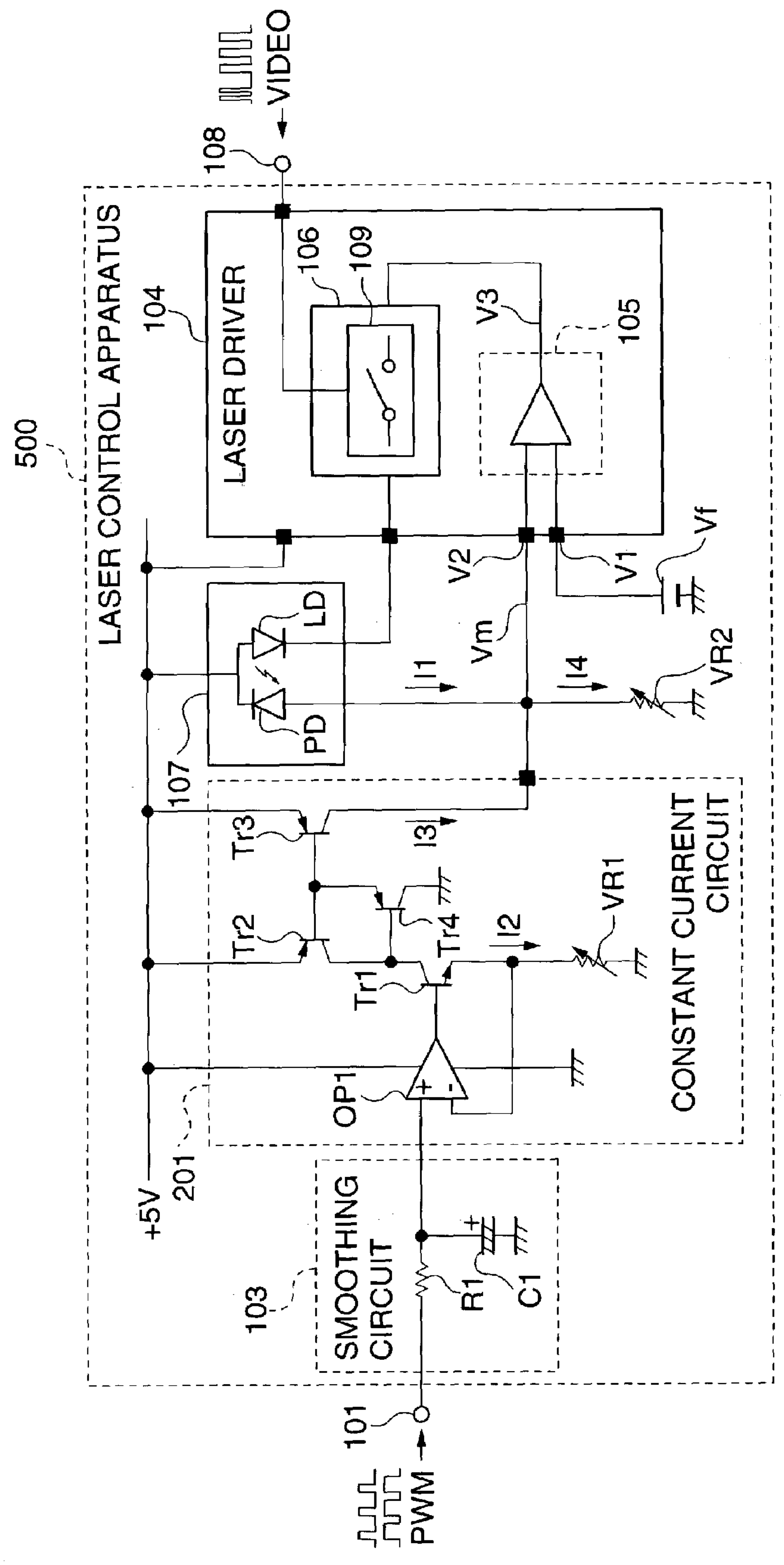
FIG. 4 is a circuit diagram showing the construction of a laser control apparatus as an emission control apparatus according to a third embodiment of the present invention.

FIG. 4 is a circuit diagram showing the construction of a laser control apparatus as an emission control apparatus according to the third embodiment. Elements and parts corresponding to those in FIG. 1 are denoted by the same reference numerals, and description thereof is omitted.

The PWM signal inputted to the input terminal 101 is supplied to the smoothing circuit 103 as in the first embodiment. The output terminal of the smoothing circuit 103 is connected to an input terminal of a constant current circuit 201. The constant current circuit 201 is configured to output current according to the output voltage of the smoothing circuit 103. Specifically, the constant current circuit 201 is comprised of an operational amplifier OP1, an NPN transistor Tr1, a PNP transistor Tr2, a PNP transistor Tr3, a PNP transistor Tr4, and a variable resistor VR1.

A description will now be given of the operation of the present embodiment.

First, when the output voltage of the smoothing circuit 103 is applied to a positive input terminal of the operational amplifier OP1, the transistor Tr1 is turned on. This causes the transistor Tr4 to be turned on and hence the transistor Tr2 and the transistor Tr3 to be turned on. Accordingly, a current I2 flows through the transistor Tr1. The operational amplifier OP1 then provides feedback control such that the current I2 is varied until the value of I2×VR1 is equal to the input voltage value of the PWM signal. The transistors Tr2, Tr3, and Tr4 constitute a current mirror circuit, in which a collector current I3 of the transistor Tr3 is set to be equal to I2.

The laser light intensity monitor voltage Vm is determined by the detection current I1 of the photo diode PD, the collector current I3 of the transistor Tr3, and the resistance value of the variable resistor VR2 such that Vm=(I1+I3)×VR2.

The laser light intensity setting amplifier 105 then compares the laser light intensity monitor voltage Vm with the laser light intensity setting reference voltage Vf, and the driving circuit 106 sets the intensity of laser light emitted from the semiconductor laser section 107 according to the output voltage V3 outputted from the laser light intensity setting amplifier 105 based on the comparison result. Thus, laser light can be emitted in a stable manner.

As described above, according to the present embodiment, the collector current I3 corresponding to current according to the PWM signal is superposed on the detection current I1 generated by the photo diode PD according to the intensity of laser light emitted from the semiconductor laser diode LD, thus making variable the laser light intensity monitor voltage Vm. In this way, the laser light intensity is variably controlled.

Incidentally, according to the present embodiment, in consideration of the fact that the amplitude of the PWM signal may fluctuate with variations in voltage supplied from the power supply of the main body of the laser printer, it is preferred that if a high accuracy is required, the voltage of the power supply is adjusted when the printer is assembled and when the scanner unit is replaced.

A description will now be given of a fourth embodiment of the present invention. The fourth embodiment differs from the third embodiment in that the voltage amplitude of the PWM signal is stabilized.

Figure 5:
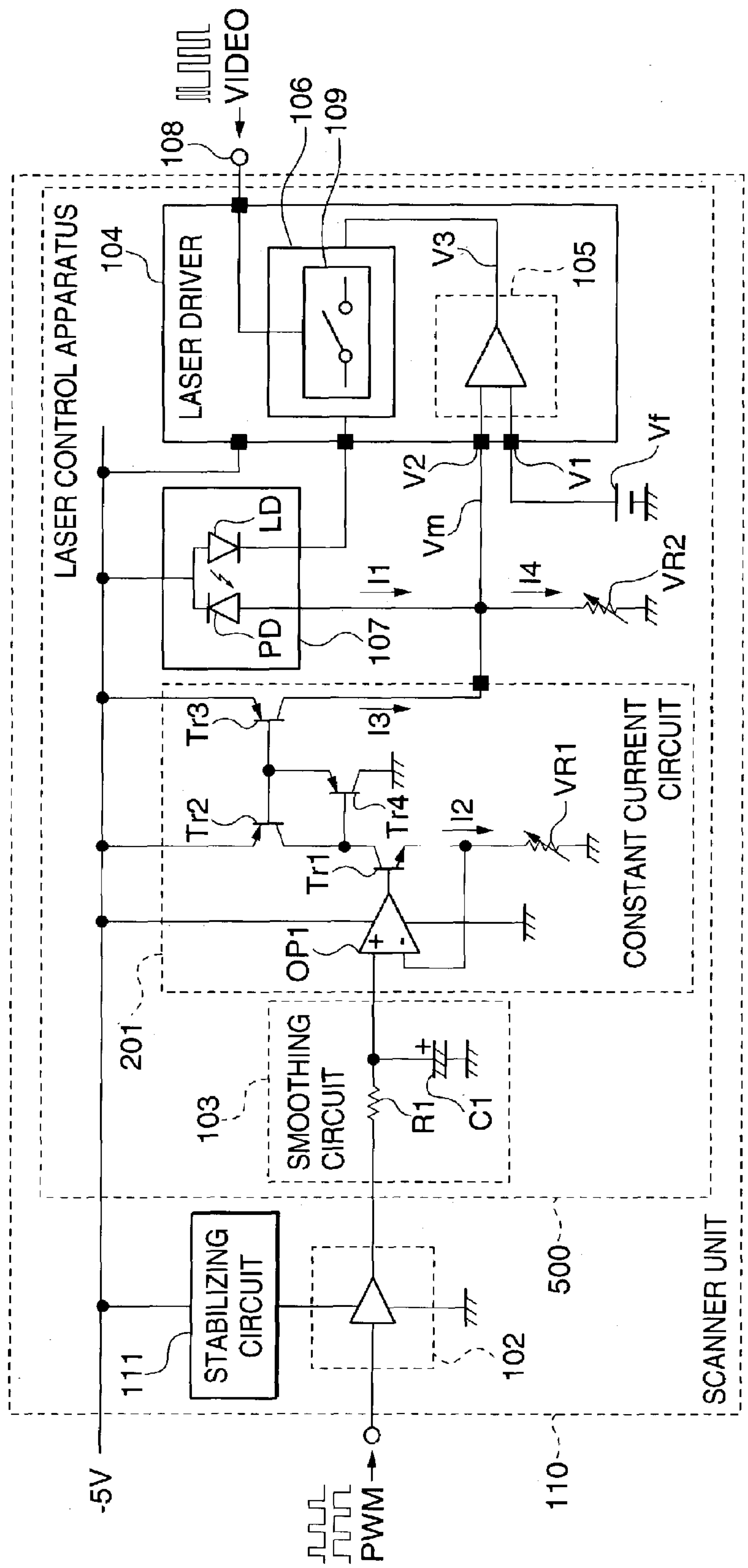
FIG. 5 is a circuit diagram showing the construction of a laser control apparatus as an emission control apparatus according to a fourth embodiment of the present invention.

FIG. 5 is a circuit diagram showing the construction of a laser control apparatus as an emission control apparatus according to the fourth embodiment of the present invention. Elements and parts corresponding to those in FIG. 4 are denoted by the same reference numerals, and description thereof is omitted.

In the present embodiment, in the same laser light intensity setting system as in the third embodiment, the stabilizing circuit 111 and the buffer circuit 102 are provided in the scanner unit 110 so as to stabilize the voltage amplitude of the PWM signal.

As in the above described second embodiment, assuming that the set output voltage of the stabilizing circuit 111 is 4V, if the PWM signal whose amplitude fluctuates in the range of 3.0 to 3.6V is inputted to the buffer circuit 102, the voltage amplitude of the PWM signal having passed through the buffer circuit 102 is constant at 4V. This stabilizes the corrector current I2 of the transistor Tr1, so that the corrector current I3 of the transistor Tr3 is stabilized due to the mirror circuit configuration.

In this way, the laser light intensity monitor voltage Vm can be made variable without being affected by variations in the amplitude of the PWM signal.

According to the present embodiment, providing the stabilizing circuit 11 and the buffer circuit 102 in the scanner unit 110 eliminates the necessity of adjusting the voltage of the power supply when the printer is assembled and when the scanner unit 110 is replaced.

The above described emission control apparatus according to the present invention makes it possible to variably control the light beam intensity in a stable manner with a simple arrangement without causing an increase in the circuit size as in the prior art or necessitating providing an AD converter, a D/A converter, or the like.

Further, an image forming apparatus including the above described emission control apparatus can set the optimum light beam intensity for image formation with simple arrangement.

It should be understood that the present invention is not limited to the embodiments disclosed, but various variations of the above described embodiments may be possible without departing from the spirits of the present invention.

What is claimed is:

1. An emission control apparatus comprising:

a light emitting element that emits a light beam;

a light receiving element that detects an intensity of the light beam emitted from said light emitting element;

a driving unit that supplies driving current to said light emitting element;

a switching unit that switches the driving current according to a video signal;

a receiving terminal that receives a pulse width modulation signal indicative of a target intensity for the light beam;

a smoothing unit that smooths the received pulse width modulation signal into a smoothed voltage; and a controller that receives the smoothed voltage and controls a value of the driving current according to the smoothed voltage such that the detected intensity of the light beam is equal to the target intensity.

2. An emission control apparatus according to claim 1, further comprising:

a current-to-voltage converter that converts current corresponding to the detected intensity of the light beam outputted from said light receiving element into voltage; and a comparator that carries out comparison between the voltage obtained by converting the current and the smoothed voltage;

wherein said controller controls the value of the driving current according to a result of the comparison.

3. An emission control apparatus according to claim 2, still further comprising a stabilizing unit that stabilizes amplitude of the received pulse width modulation signal.

4. An image forming apparatus including an emission control apparatus according to claim 1.

5. An emission control apparatus comprising:

a light emitting element that emits a light beam;

a light receiving element that detects an intensity of the light beam emitted from said light emitting element;

a driving unit that supplies driving current to said light emitting element;

a controller that controls a value of the driving current such that the detected intensity of the light beam is equal to a target intensity;

a switching unit that switches the driving current according to a video signal;

a receiving terminal that receives a pulse width modulation signal; and a smoothing unit that smooths the received pulse width modulation signal into smoothed voltage, wherein the smoothed voltage obtained by said smoothing unit is added to a voltage corresponding to the detected intensity of the light beam.

6. An image forming apparatus including an emission control apparatus according to claim 5.

7. An emission control apparatus according to claim 5, further comprising:

a current generator that generates current according to the smoothed voltage; and a current-to-voltage converter that converts current obtained by adding together the current generated by said current generator and current corresponding to the detected intensity of the light beam, into voltage, wherein said controller controls the value of the driving current according to the voltage converted from the current by said current-to-voltage converter.

8. An emission control apparatus according to claim 7, further comprising a stabilizing unit that stabilizes amplitude of the received pulse width modulation signal.

* * * * *